(12) United States Patent
Schmid et al.

(10) Patent No.: US 7,569,818 B2
(45) Date of Patent: Aug. 4, 2009

(54) METHOD TO REDUCE CROSS TALK IN A MULTI COLUMN E-BEAM TEST SYSTEM

(75) Inventors: Ralf Schmid, Narzissenweg (DE); Thomas Schwedes, Muehldorf (DE)

(73) Assignee: Applied Materials, Inc., Santa Clara, CA (US)

( * ) Notice: Subject to any disclaimer, the term of this patent is extended or adjusted under 35 U.S.C. 154(b) by 324 days.

(21) Appl. No.: 11/684,745

(22) Filed: Mar. 12, 2007

(65) Prior Publication Data

US 2007/0216428 A1    Sep. 20, 2007

Related U.S. Application Data

(60) Provisional application No. 60/782,377, filed on Mar. 14, 2006.

(51) Int. Cl.
*G01N 23/225*    (2006.01)
(52) U.S. Cl. .................. 250/310; 250/306; 250/307; 250/492.3
(58) Field of Classification Search .................. 250/306, 250/307, 310, 492.3; 345/98, 99; 73/865.9
See application file for complete search history.

(56) References Cited

U.S. PATENT DOCUMENTS

| | | | |
|---|---|---|---|
| 3,983,401 A | 9/1976 | Livesay | |
| 4,090,056 A | 5/1978 | Lockwood et al. | |
| 4,362,945 A | 12/1982 | Rieke | |
| 4,437,044 A | 3/1984 | Veith | |
| 4,495,966 A | 1/1985 | Longamore | |
| 4,528,452 A | 7/1985 | Livesay | |
| 4,532,423 A | 7/1985 | Tojo et al. | |
| 4,684,808 A | 8/1987 | Plies et al. | |
| 4,725,736 A | 2/1988 | Crewe | |
| 4,740,705 A | 4/1988 | Crewe | |
| 4,760,567 A | 7/1988 | Crewe | |
| 4,761,607 A | 8/1988 | Shiragasawa et al. | |
| 4,764,818 A | 8/1988 | Crew | |

(Continued)

FOREIGN PATENT DOCUMENTS

DE    3636316    5/1989

(Continued)

OTHER PUBLICATIONS

International Search Report and Written Opinion of the International Searching Authority, mailed Apr. 2, 2008 (PCT/US07/63759;).

(Continued)

*Primary Examiner*—David A Vanore
*Assistant Examiner*—Michael Maskell
(74) *Attorney, Agent, or Firm*—Patterson & Sheridan, LLP

(57) ABSTRACT

A method and apparatus for reducing or eliminating crosstalk between a plurality of electron beams is described. The plurality of electron beams may produce test areas on a large area substrate that are adjacent wherein secondary electrons from one test area may be detected in an adjacent test area. In one embodiment, the timing of a primary beam emission and detection of secondary electrons from that primary beam is controlled to eliminate or reduce the possibility of detection of secondary electrons from another primary beam.

25 Claims, 7 Drawing Sheets

U.S. PATENT DOCUMENTS

| | | |
|---|---|---|
| 4,795,912 A | 1/1989 | Maschke |
| 4,818,933 A | 4/1989 | Kerschner et al. |
| 4,819,038 A | 4/1989 | Alt |
| 4,843,312 A | 6/1989 | Hartman et al. |
| 4,862,075 A | 8/1989 | Choi et al. |
| 4,870,357 A | 9/1989 | Young et al. |
| 4,899,105 A | 2/1990 | Akiyama |
| 4,965,515 A | 10/1990 | Karasawa |
| 4,983,833 A | 1/1991 | Brunner et al. |
| 4,985,676 A | 1/1991 | Karasawa |
| 4,985,681 A | 1/1991 | Brunner et al. |
| 5,081,687 A | 1/1992 | Henley et al. |
| 5,124,635 A | 6/1992 | Henley |
| 5,170,127 A | 12/1992 | Henley |
| 5,175,495 A | 12/1992 | Brahme et al. |
| 5,177,437 A | 1/1993 | Henley |
| 5,268,638 A | 12/1993 | Brunner et al. |
| 5,278,494 A | 1/1994 | Obigane |
| 5,285,150 A | 2/1994 | Henley |
| 5,313,156 A | 5/1994 | Klug et al. |
| 5,368,676 A | 11/1994 | Nagaseki et al. |
| 5,369,359 A | 11/1994 | Schmitt |
| 5,371,459 A | 12/1994 | Brunner et al. |
| 5,414,374 A | 5/1995 | Brunner et al. |
| 5,432,461 A | 7/1995 | Henley |
| 5,504,438 A | 4/1996 | Henley |
| 5,528,158 A | 6/1996 | Sinsheimer et al. |
| 5,530,370 A | 6/1996 | Larighof et al. |
| 5,558,717 A | 9/1996 | Zhao et al. |
| 5,621,333 A | 4/1997 | Long et al. |
| 5,644,245 A | 7/1997 | Saitoh et al. |
| 5,657,139 A | 8/1997 | Hayashi |
| 5,691,764 A | 11/1997 | Takeoshi et al. |
| 5,742,173 A | 4/1998 | Nakagomi et al. |
| 5,774,100 A | 6/1998 | Aoki et al. |
| 5,801,545 A | 9/1998 | Takekoshi et al. |
| 5,801,764 A | 9/1998 | Koizumi et al. |
| 5,834,007 A | 11/1998 | Kubota |
| 5,834,773 A | 11/1998 | Brunner et al. |
| 5,892,224 A | 4/1999 | Nakasuji |
| 5,923,180 A | 7/1999 | Botka et al. |
| 5,936,687 A | 8/1999 | Lee |
| 5,973,323 A | 10/1999 | Adler et al. |
| 5,982,190 A | 11/1999 | Toro-Lira |
| 6,033,281 A | 3/2000 | Toro-Lira |
| 6,046,599 A | 4/2000 | Long et al. |
| 6,075,245 A * | 6/2000 | Toro-Lira ............... 250/310 |
| 6,086,362 A | 7/2000 | White et al. |
| 6,137,303 A | 10/2000 | Deckert et al. |
| 6,145,648 A | 11/2000 | Teichman et al. |
| 6,198,299 B1 | 3/2001 | Hollman |
| 6,265,889 B1 | 7/2001 | Tomita et al. |
| 6,281,701 B1 | 8/2001 | Yang et al. |
| 6,288,561 B1 | 9/2001 | Leedy |
| 6,297,656 B1 | 10/2001 | Kobayashi et al. |
| 6,320,568 B1 | 11/2001 | Zavracky |
| 6,337,722 B1 | 1/2002 | Ha |
| 6,337,772 B2 | 1/2002 | Uehara et al. |
| 6,340,963 B1 | 1/2002 | Anno et al. |
| 6,343,369 B1 | 1/2002 | Saunders et al. |
| 6,362,013 B1 | 3/2002 | Yoshimura |
| 6,380,729 B1 | 4/2002 | Smith |
| 6,450,469 B1 | 9/2002 | Okuna |
| 6,501,289 B1 | 12/2002 | Takeoshi |
| 6,528,767 B2 | 3/2003 | Bagley et al. |
| 6,559,454 B1 | 5/2003 | Murrell et al. |
| 6,566,897 B2 | 5/2003 | Lo et al. |
| 6,570,553 B2 | 5/2003 | Hashimoto et al. |
| 6,730,906 B2 | 5/2004 | Brunner et al. |
| 6,765,203 B1 | 7/2004 | Abel |
| 6,777,675 B2 | 8/2004 | Parker et al. |
| 6,828,587 B2 | 12/2004 | Yamazaki et al. |
| 6,833,717 B1 | 12/2004 | Kurita et al. |
| 6,873,175 B2 | 3/2005 | Toro-Lira |
| 6,992,290 B2 | 1/2006 | Watanabe et al. |
| 6,995,576 B2 | 2/2006 | Imai |
| 7,005,641 B2 | 2/2006 | Nakasuji et al. |
| 7,077,019 B2 | 7/2006 | Weis et al. |
| 7,084,970 B2 | 8/2006 | Weis et al. |
| 7,088,117 B2 | 8/2006 | Uher et al. |
| 7,137,309 B2 | 11/2006 | Weis et al. |
| 7,180,084 B2 | 2/2007 | Weis et al. |
| 2002/0024023 A1 | 2/2002 | Brunner et al. |
| 2002/0034886 A1 | 3/2002 | Kurita et al. |
| 2002/0047838 A1 | 4/2002 | Aoki et al. |
| 2003/0209323 A1 | 11/2003 | Yokogaki |
| 2003/0218456 A1 | 11/2003 | Brunner et al. |
| 2004/0145383 A1 | 7/2004 | Brunner et al. |
| 2005/0040338 A1 | 2/2005 | Weis et al. |
| 2005/0179451 A1 | 8/2005 | Brunner et al. |
| 2005/0179452 A1 | 8/2005 | Brunner et al. |
| 2006/0038554 A1 | 2/2006 | Kurita et al. |

FOREIGN PATENT DOCUMENTS

| | | |
|---|---|---|
| DE | 19832297 | 9/2001 |
| EP | 0204855 | 12/1986 |
| EP | 0370276 | 1/1991 |
| EP | 0402499 | 9/1991 |
| EP | 0537505 | 11/1993 |
| EP | 0523594 | 12/1993 |
| EP | 0523584 | 6/1994 |
| EP | 0614090 | 9/1994 |
| EP | 0542094 | 11/1994 |
| EP | 0762137 | 3/1997 |
| EP | 0806700 | 11/1997 |
| EP | 0932182 | 7/1999 |
| EP | 0999573 | 5/2000 |
| EP | 1045425 | 10/2000 |
| EP | 1045426 | 10/2000 |
| EP | 1233274 | 8/2002 |
| JP | 60-039748 | 3/1985 |
| JP | 6-167538 | 4/1986 |
| JP | 63-88741 | 4/1988 |
| JP | 63-88742 | 4/1988 |
| JP | 63-166132 | 7/1988 |
| JP | 63-318054 | 12/1988 |
| JP | 1-307148 | 12/1989 |
| JP | 7-302563 | 11/1995 |
| JP | 8-173418 | 7/1996 |
| JP | 1-213944 | 8/1999 |
| JP | 11-264940 | 9/1999 |
| JP | 2000-180392 | 6/2000 |
| JP | 2000-223057 | 8/2000 |
| JP | 2000-268764 | 9/2000 |
| JP | 2001-033408 | 2/2001 |
| JP | 2001-318116 | 11/2001 |
| JP | 2001-358189 | 12/2001 |
| JP | 2002-039976 | 2/2002 |
| JP | 2002-048740 | 2/2002 |
| JP | 2002-257997 | 9/2002 |
| JP | 2002-310959 | 10/2002 |
| JP | 2002-343294 | 11/2002 |
| JP | 2004-014402 | 1/2004 |
| JP | 8-289231 | 11/2006 |
| TW | 344876 | 11/1998 |
| TW | 427551 | 3/2001 |
| TW | 459140 | 10/2001 |
| TW | 473772 | 1/2002 |
| TW | 511207 | 11/2002 |
| TW | 512428 | 12/2002 |
| TW | 536630 | 6/2003 |
| TW | 2003-01535 | 7/2003 |

| | | |
|---|---|---|
| TW | 541430 | 7/2003 |
| WO | WO 92-09900 | 6/1992 |
| WO | WO 98-31050 | 7/1998 |
| WO | WO 99-23684 | 5/1999 |
| WO | WO 99-60614 | 11/1999 |
| WO | WO 02-33745 | 4/2002 |
| WO | WO 02-45137 | 6/2002 |

OTHER PUBLICATIONS

Brunner, et al., "Development of Puma 5500/10K Platform," AKT News, vol. 5, Jan. 2001, pp. 13-14.

Brunner, et al., "TFT Array Testing: Replacing Mechanics by Electron Beam Deflection," AKT News, vol. 6, Apr. 2001, pp. 15-17.

Kumada, et al., "Non-Contact Array Testers.", 2002.

* cited by examiner

METHOD TO REDUCE CROSS TALK IN A MULTI COLUMN E-BEAM TEST SYSTEM

CROSS-REFERENCE TO RELATED APPLICATIONS

This application claims benefit of U.S. Provisional Application Ser. No. 60/782,377, filed Mar. 14, 2006, which is incorporated by reference herein in its entirety.

BACKGROUND OF THE INVENTION

1. Field of the Invention

Embodiments of the present invention generally relate to a method and system for testing substrates. More particularly, the embodiments relate to a method of testing and system for testing large area substrates in the production of flat panel displays.

2. Description of the Related Art

Flat panel displays, such as, for example active matrix liquid crystal displays (LCD's), have recently become commonplace in the world as a replacement for the cathode ray tubes of the past. A LCD has several advantages over the CRT, including higher picture quality, lighter weight, lower voltage requirements, and low power consumption. The displays have many applications in computer monitors, cell phones and televisions to name but a few.

A part of the LCD manufacturing process requires testing of the flat panel substrate to determine the operability of pixels. Voltage imaging, charge sensing, and electron beam testing are some processes used to monitor and troubleshoot defects during the manufacturing process. In a typical electron beam testing process, the response of the pixels is monitored to provide defect information. In one example of electron beam testing, certain voltages are applied to the pixels, and an electron beam may be directed to the individual pixel electrodes under investigation. Secondary electrons emitted from the pixel electrode area are sensed to determine the TFT voltages.

The demand for larger displays, increased production, and lower manufacturing costs has created a need for new testing systems that can accommodate larger substrate sizes using minimal clean room space. Current flat panel display processing equipment generally accommodates large area substrates up to about 2200 mm by 2500 mm and larger. The size of the processing equipment as well as process throughput time is a great concern to flat panel display manufacturers, both from a financial standpoint and a design standpoint.

To meet this challenge, test systems have been developed wherein the testing chamber is slightly larger than a width or a length of the large area substrate in one dimension and the substrate is processed in at least one linear direction during testing. This unidirectional movement may require one or more electron beam columns, and the columns' respective address area, to be in closer proximity, thereby creating the possibility of cross-talk between adjacent columns. This cross-talk may produce testing challenges if not reduced or eliminated.

Therefore, there is a need for a test system to perform testing on large area substrates that minimizes clean room space and reduces testing time, and a method of reducing cross-talk between the address areas of the testing apparatus.

SUMMARY OF THE INVENTION

In one embodiment, a method of reducing cross-talk between at least a first electron beam column and at least a second electron beam column neighboring the first electron beam column is described. The method includes providing a first trigger event, emitting a first electron beam pulse on a substrate with the first electron beam column a first predetermined time after the first trigger event, detecting a first signal caused by the first electron beam pulse at a second predetermined time after the first trigger event in a first read window, providing a second trigger event, emitting a second electron beam pulse on the substrate with the second electron beam column a third predetermined time after the second trigger event, and detecting a second signal caused by the second electron beam pulse a fourth predetermined time after the second trigger event in a second first read window, wherein the first read window and the second read window occupy different time periods.

In another embodiment, a method of reducing crosstalk between a plurality of odd-numbered electron beam columns with a plurality of even-numbered electron beam columns therebetween is described. The method includes providing a master clock signal having a rising edge and a falling edge, synchronizing a first pulse of electrons from the plurality of odd-numbered electron beam columns or the at least one even-numbered electron beam column that coincides with the rising edge, and synchronizing a second pulse of electrons from the plurality of odd-numbered electron beam columns or the at least one even-numbered electron beam column that coincides with the falling edge, wherein the first pulse and second pulse are separated by a delay.

In another embodiment, an electron beam test system is described. The apparatus includes a plurality of electron beam columns which include one or more odd-numbered columns and one or more even-numbered columns, each of the plurality of electron beam columns including a blanking system and a detector, and a synchronizing device having a master clock signal defining a first trigger event and a second trigger event, wherein the blanking system and detector of each electron beam column is in communication with the master clock signal and the blanking system of the one or more odd-numbered columns are triggered at the first trigger event, and the blanking system of the one or more even-numbered columns are triggered at the second trigger event, or vice-versa.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The term substrate as used herein refers generally to large area substrates made of glass, a polymeric material, or other substrate materials suitable for having an electronic device formed thereon. Without limiting the scope of protection of the present application, the testing columns described herein may be referred to, for example, as an electron beam column or device. Thus, the electron beam device may be an electron beam inspection system or a lithography system. Embodiments of the invention may still be applied to apparatuses using other sources of charged particles and/or other secondary and/or backscattered charged particles to obtain a specimen image.

Embodiments described herein related to voltages and potentials refer to relative and not absolute terms. For example, accelerating a beam by connecting an emitter to "ground" and applying 3 kV to a sample is equivalent to applying negative 3 kV to the emitter and placing the specimen on ground. Therefore, while some discussion is provided in terms of specific voltages for convenience, it should be understood that the reference is to relative potential.

Various embodiments described herein may be described in relation to independent directions in horizontal and vertical planes. Vertical is defined as orthogonal to a horizontal plane and will be referred to as the Z direction. Horizontal is defined as orthogonal to a vertical plane and will be referred to as the X or Y direction, the X direction being orthogonal to the Y direction, and vice-versa. The X, Y, and Z directions will be further defined with directional insets included as needed in the Figures to aid the reader.

Figure 1A:
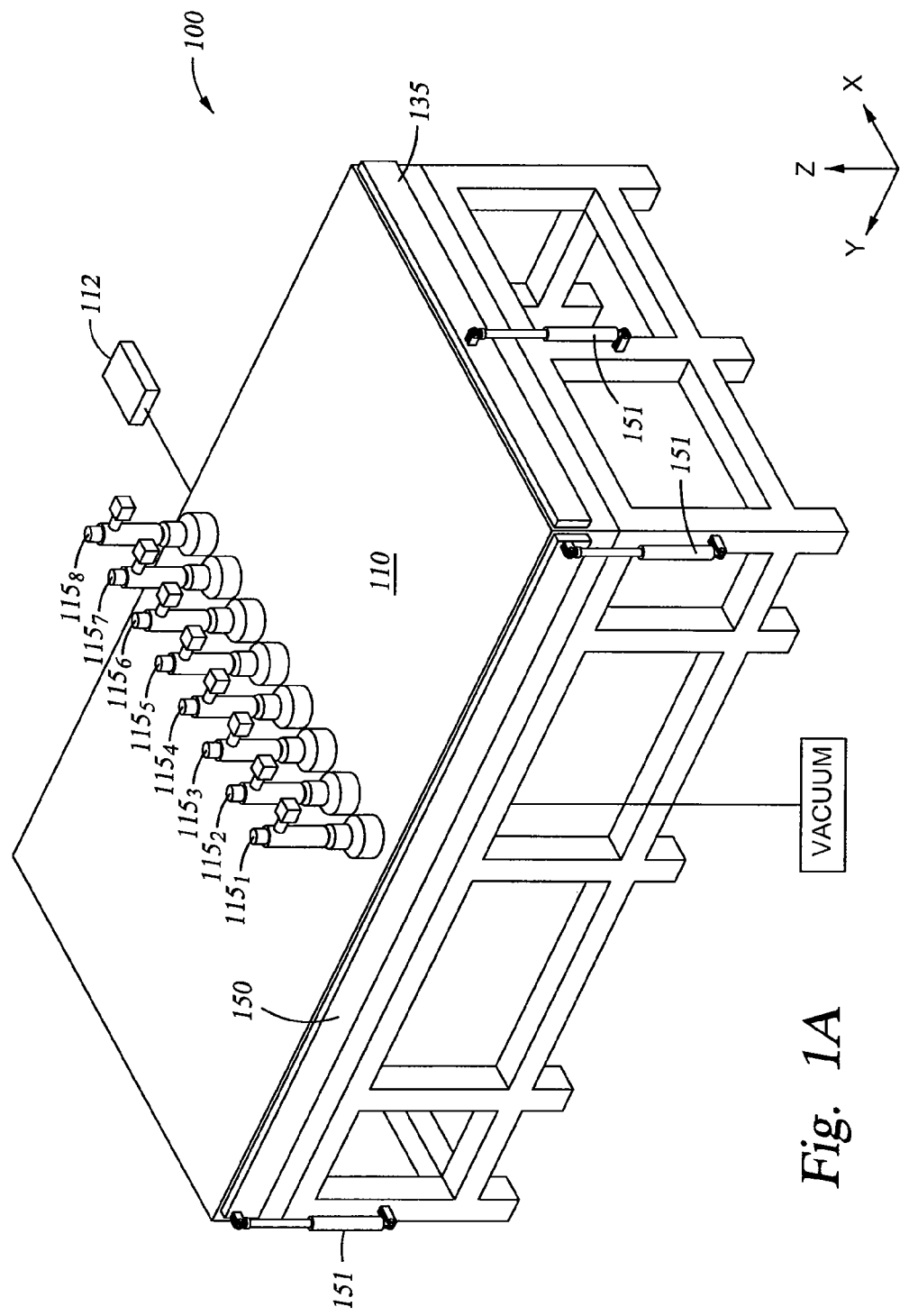
FIG. 1A is one embodiment of an electron beam test system.

FIG. 1A is an isometric view of one embodiment of a test system 100 adapted to test the operability of electronic devices located on large area flat panel substrates, for example, large area substrates having dimensions up to and exceeding about 2200 mm by about 2600 mm. The test system 100 includes at least a testing chamber 110 having a plurality of testing columns $115_n$ coupled thereto adapted to test electronic devices on flat panel displays, such as thin film transistor liquid crystal displays (TFT-LCD), field emission displays, plasma displays, and organic light emitting diode displays. Other large area substrates that may be tested by the test system 100 include solar arrays or solar panels. Further, embodiments described herein may also be used to test the operability of electronic devices on semiconductor wafers.

In one embodiment, the plurality of testing columns $115_n$ define one or more odd-numbered columns $115_1$, $115_3$, $115_5$, and $115_7$, and one or more even-numbered columns $115_2$, $115_4$, $115_6$, and $115_8$. The testing chamber 110 is coupled to a vacuum source, and may be coupled to one or more load lock chambers (not shown) to facilitate transfer of one or more large area substrates to and from the testing chamber 110. In one embodiment, the plurality of testing columns $115_n$ are electron beam columns, but may be any device configured to test operability of electronic devices located on large area substrates, such as thin film transistors (TFT's), pixels, organic light emitting diodes (OLED's), or photovoltaic cells for solar panels.

In one embodiment, the plurality of testing columns $115_n$ are coupled to an upper surface of the testing chamber 110 in a straight line configuration. In other embodiments (not shown), the plurality of testing columns $115_n$ are in a staggered or zigzag configuration and coupled to the upper surface of the testing chamber. In one embodiment, the configuration of the plurality of testing columns $115_n$ is adapted to provide a collective test area sufficient to test a length or width of a large area substrate as the substrate is moved in one direction through the system under the plurality of testing columns $115_n$ by a movable substrate support within the testing chamber. Although eight testing columns are shown, other embodiments may require more or less, depending on process requirements.

The testing chamber 110 also includes one or more access ports or movable doors 150 and 135 that are opened and closed by actuators 151. The movable doors 150, 135 provide access to the interior volume of the testing chamber 110 when opened and provide a sealing function when closed. In one application, the door 135 may be opened to facilitate transfer of a large area substrate into and out of the interior volume of the testing chamber 110, and the door 150 may be opened to facilitate transfer of a testing device, such as a prober, into and out of the interior volume of the testing chamber 110. When transfer of the prober and/or the substrate is complete, the doors 150, 135 may be closed, and the testing chamber 110 may be pumped down by the vacuum source.

The test system 100 is adapted to test a plurality of electronic devices located on a large area substrates using a beam of electrons from the testing columns $115_n$. In an example of operation, the test system 100 uses a prober (not shown) to provide and/or sense voltages from the pixels located on the large area substrate. For example, the prober may provide a voltage to the plurality of pixels by, for example, contacting one or more shorting bars or driving circuits on the large area substrate. Electrons are emitted from the plurality of testing columns and impinge on pixels in electrical communication with the TFT's. Secondary electrons emitted from the large area substrate are detected and registered to determine operability of the pixels. An example of a prober suitable for use in the test system 100 is described in U.S. patent application Ser. No. 10/889,695, filed Jul. 12, 2004, which published as United States Patent Publication No. 2005/0179451, and Ser. No. 10/903,216, filed Jul. 30, 2004, which published as United States Patent Publication No. 2005/0179452, which applications are both incorporated herein by reference in their entireties.

The test system 100 is shown coupled to a controller 112 that facilitates operation of the various systems and subsystems within the test system 100. In one embodiment, the controller 112 provides a master clock signal used to synchronize each of the plurality of testing columns $115_n$. For example, rising and falling edges of the master clock signal may serve as trigger events for different groups of the plurality of testing columns $115_n$, such as even and odd groups of the testing columns $115_n$. For some embodiments, the controller 112 is adapted to control or synchronize a read signal or read window for detecting secondary or backscattered electrons from a primary beam pulse provided by each of the plurality of testing columns $115_n$. Functions provided by the controller 112 will be described in detail below.

Figure 1B:
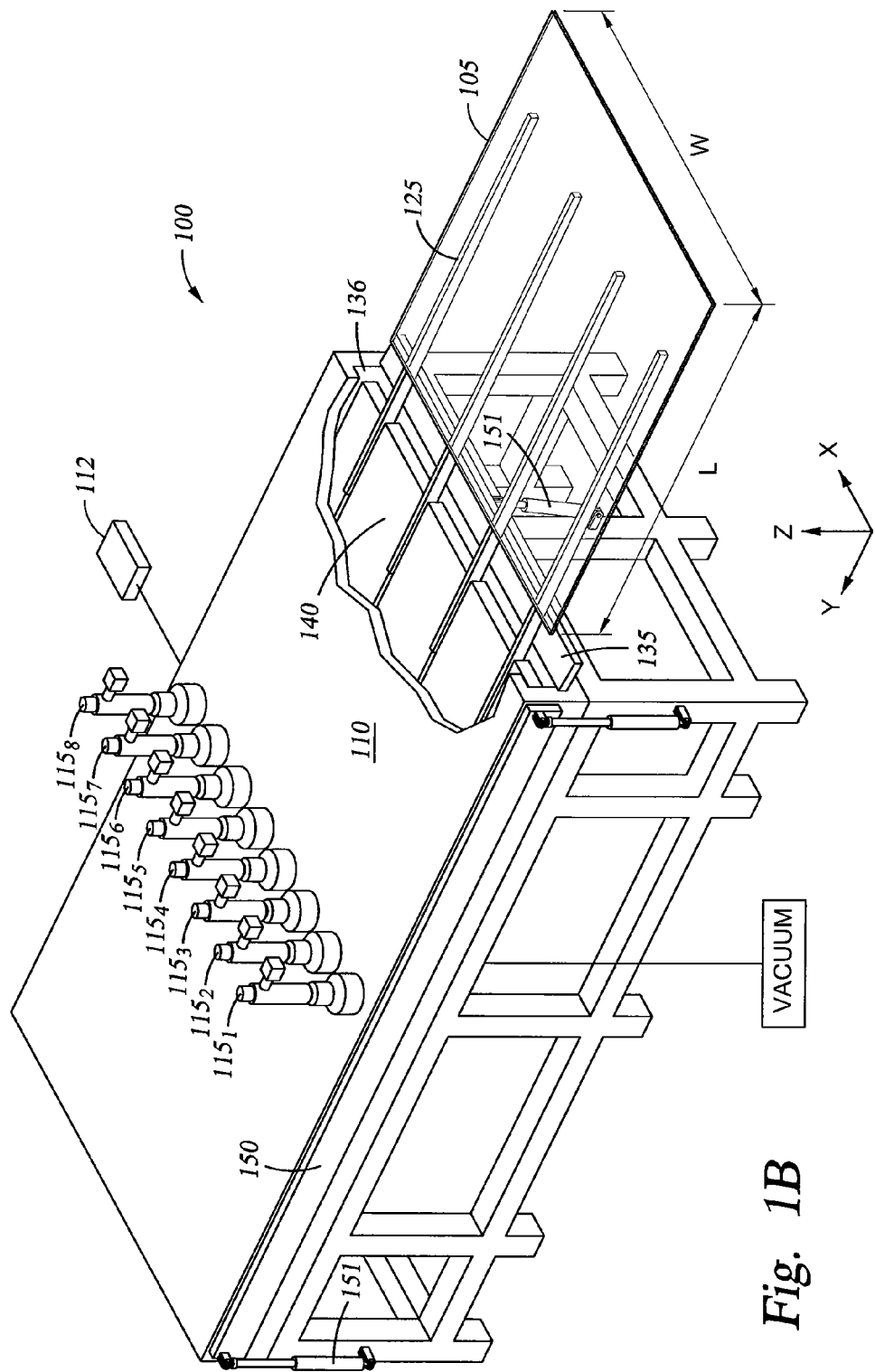
FIG. 1B is an isometric view of another embodiment of the test system shown in FIG. 1A

FIG. 1B is an isometric view of another embodiment of the test system 100 shown in FIG. 1A. A large area substrate 105 is shown in a transfer position relative to the testing chamber 110. In this embodiment, a movable substrate support or stage 140 is shown within an interior volume of the testing chamber 110. In one embodiment, the stage 140 is adapted to move horizontally in the X and Y directions within the testing chamber 110 to move the substrate 105 linearly relative to the plurality of testing columns $115_n$. In one application, the stage 140 includes a length that is approximately one half of a length of the testing chamber 110, and the length of the stage 140 is substantially equal to a length of the substrate 105. In this manner, the substrate 105 may be placed on an upper surface of the stage 140 and the stage 140 may move in horizontally (Y direction in this Figure) under the plurality of testing columns $115_n$.

The substrate 105 may be placed or displaced from an upper surface of the stage 140 by a factory interface transfer mechanism or a transfer robot located in the manufacturing facility. In one embodiment, the substrate 105 may be transferred by a plurality of end effectors 125 movably coupled to the stage 140. In one application, the plurality of end effectors 125 are adapted to extend out of an opening 136 (formed by opening door 135) to facilitate transfer of the substrate 105. The end effectors 125 are adapted to move vertically (Z direction) relative to the stage 140 by vertical movement provided by one or both of the plurality of end effectors 125 and the stage 140. After the substrate 105 has been transferred to an upper surface of the stage 140, the plurality of end effectors 125 may be housed in a plurality of slots 142 formed in the stage 140. In one embodiment, the upper surface of the stage 140 is adapted to move vertically (Z direction) relative to the plurality of end effectors 125, and the end effectors are adapted to move horizontally (Y direction) relative to the upper surface of the stage 140. In this embodiment, the plurality of end effectors 125 may support the substrate 105 when the upper surface of the stage is lowered (Z direction), and the end effectors 125 may be housed in the slots 142 when the upper surface of the stage 140 is raised (Z direction).

Various components and testing processes that may be used in the test system 100 may be found in U.S. Pat. No. 6,833,717, which issued Dec. 21, 2004, incorporated herein by reference in its entirety. An example of various components that may be used in the test system 100 may also be found in U.S. patent application Ser. No. 11/375,625, filed Mar. 14, 2006, which published as United States Patent Publication No. 2006/0244467 on Nov. 2, 2006, which is incorporated herein by reference in its entirety.

Once a large area substrate 105 has been introduced into the testing chamber 110, the testing chamber 110 may be sealed and pumped down by the vacuum source. A prober may be coupled to the substrate and a testing sequence may commence by moving the substrate on the stage 140 linearly under the plurality of testing columns $115_n$. The linear, unidirectional movement of the stage 140 may be constant, or in a step-wise or intermittent fashion. After the substrate 105 has been tested, the substrate may be transferred out of the chamber at an end of the testing chamber 110 opposite the end the substrate was introduced, or the stage 140 may move the substrate 105 back to the originating position and the substrate 105 may be removed out of the opening 136. Another untested substrate may be transferred to the testing chamber 110 and a testing process on the untested substrate may begin.

In one embodiment, each of the testing columns $115_n$ are configured to emit a beam of electrons directed toward the substrate 105. In one embodiment, the configuration of the plurality of testing columns $115_n$ provide a collective test area that is adapted to test the entire width W or length L of the substrate 105 as the substrate is moved under the electron beam columns. For example, if the substrate 105 is provided to the testing chamber 110 lengthwise as shown in FIG. 1B, the plurality of testing columns $115_n$ are adapted to provide a collective test area that covers the entire width W of the substrate 105. Conversely, if the substrate 105 is provided to the testing chamber 110 widthwise, the plurality of testing columns $115_n$ are adapted to provide a collective test area that covers the entire length L of the substrate 105.

In one embodiment, a large area substrate is provided to the test system 100 and six testing columns $115_n$ may be used to test the substrate as the substrate is moved through the system. In another embodiment, the large area substrate 105 is provided to the test system 100 and eight testing columns $115_n$ may be used to test the substrate as the substrate is moved through the system. The invention is not limited to the number of electron beam columns disclosed and the actual number may be more or less depending on substrate size and test area formed on the substrate by the electron beam or beams from the testing columns $115_n$. In other embodiments, the large area substrate may be provided to the test system and the plurality of testing columns $115_n$ provide a collective test area that is less than the length L or width W of the substrate. In this embodiment, a portion of the length L or width W of the large area substrate may be tested as the substrate is moved through the system, or the entire width W or length L of the substrate may be tested using a substrate support or stage capable of X directional movement and Y directional movement. In this manner, the entire width W or length L may be tested by moving and positioning the substrate in multiple horizontal (X and Y directions) positions, as needed to access various portions of the substrate, under the plurality of testing columns $115_n$.

Figure 2:
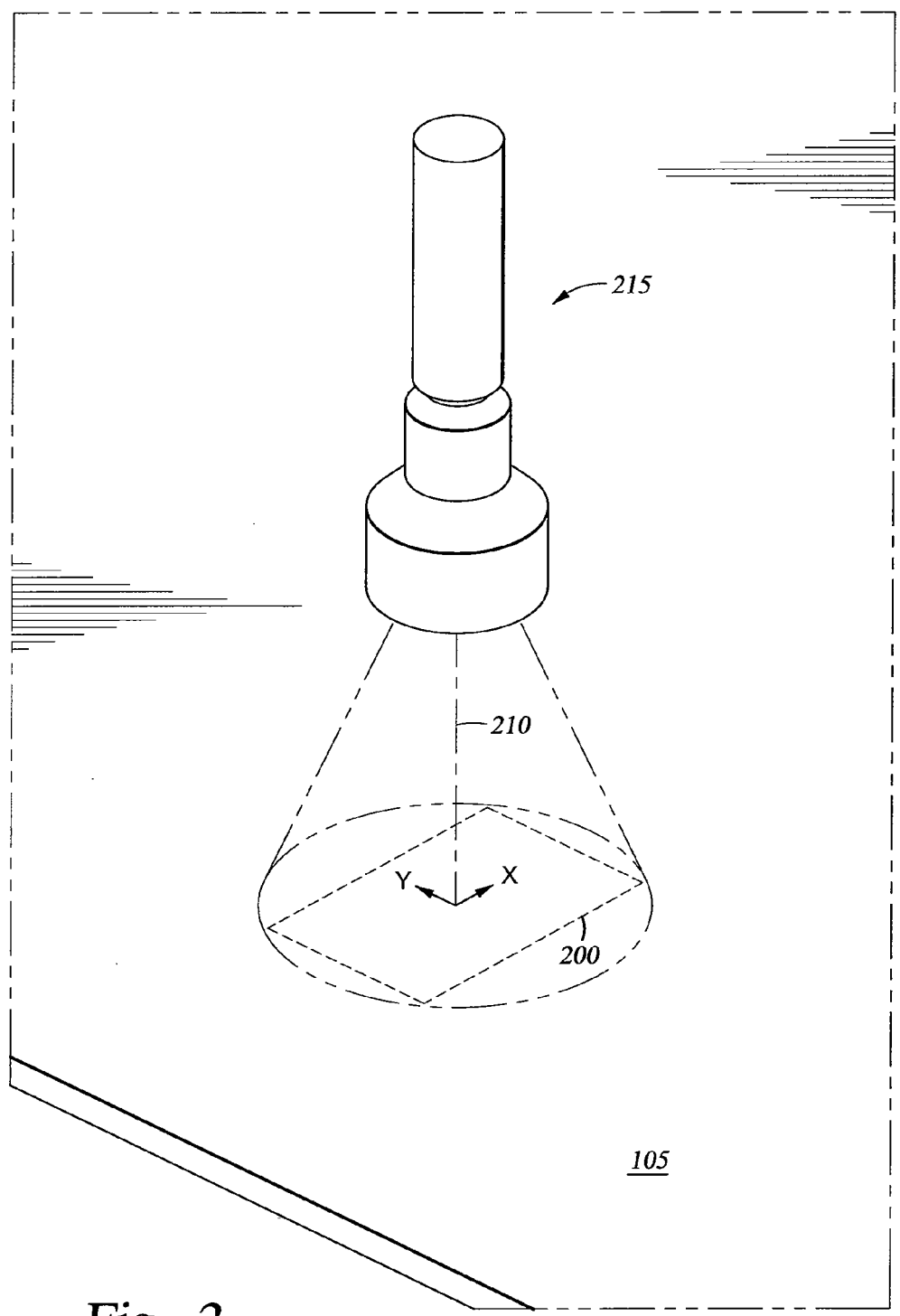
FIG. 2 is one embodiment of a testing column.

FIG. 2 is an isometric view of one embodiment of a testing column as shown in FIGS. 1A and 1B, which in this embodiment is an electron beam column 215. The electron beam column 215 includes an optical axis 210. In one embodiment, each of the plurality of testing columns described in FIGS. 1A and 1B has an optical axis 210 that may be defined by the longitudinal axis of an objective lens of each testing column $115_n$. The optical axis 210 of the electron beam column 215 generally includes a center region of a test area 200 on a large area substrate 105. Each electron beam column 215 is configured to produce the test area 200 that may be defined, in one embodiment, as the quality address area or addressable area of the beam of electrons generated by the electron beam column 215 on the substrate 105. In another embodiment, the test area 200 may be defined as field of view or scan field of the electron beam emitted by the column 215, and generally includes a deflection range which is addressable by deflecting the electron beam. As extensive deflection may decrease the beam quality on the substrate, addressable is generally referred to as the deflection range that may be applied to the beam with a determined beam quality.

In one application, the test area 200 of each electron beam column 215 is measured diagonally and the diagonal measurement is between about 380 mm to about 440 mm, for example about 410 mm to about 430 mm. In some applications, the test area 200 each electron beam column 215 produces on the substrate 105 is measured linearly in the X and Y directions and is between about 230 mm to about 270 mm in the Y direction and about 340 mm to about 380 in the X direction. In another embodiment (not shown), the test area 200 in the X direction and the Y direction may be similar. Thus, in one embodiment, the test area 200 may be about 300 mm by about 300 mm or larger. In some applications, the test area 200 measured in the X direction may be between about 305 mm to about 330 mm. In another embodiment, the test area 200 is between about 240 mm to about 260 mm in the Y direction, for example about 250 mm, and about 350 mm to about 370 mm in the X direction, for example about 360 mm.

In another embodiment, the test area 200 of each electron beam column is between about 325 mm to about 375 mm in the Y direction and about 240 mm to about 290 mm in the X direction. In another embodiment, the test area 200 is between about 355 mm to about 365 mm in the Y direction, for example about 345 mm, and about 260 mm to about 280 mm in the X direction, for example about 270 mm. In other embodiments, the test area 200 is smaller or greater than the dimensions mentioned above. For example, the test area 200 may have a smaller area than described above and more electron beam columns may be used. In another example, the test area 200 may be larger than described above and less electron beam columns may be used. Thus, the test area 200 of each electron beam column 215 is used to produce a collective test area on the substrate based on substrate size and/or a user's preference.

Figure 3A:
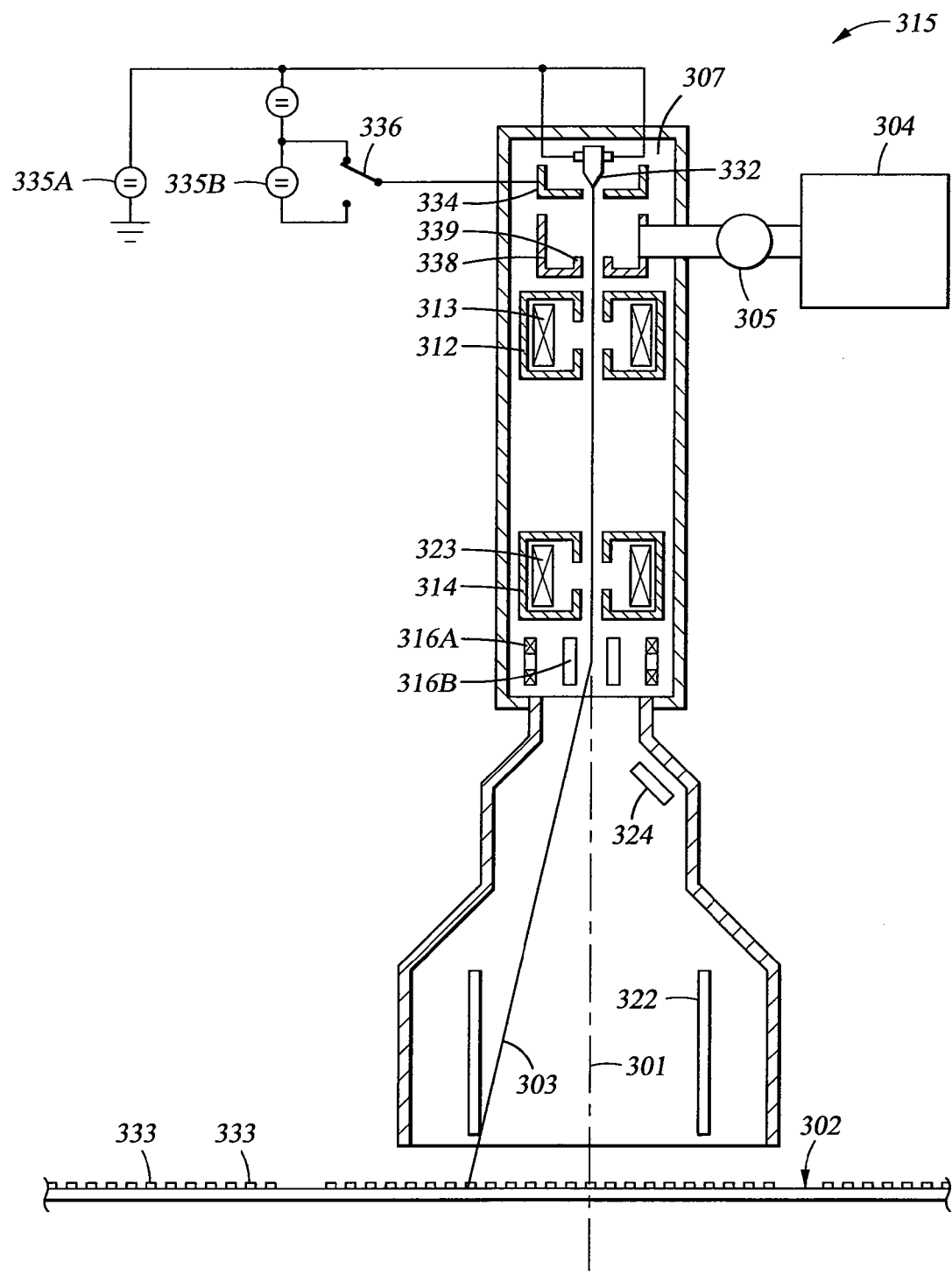
FIG. 3A is another embodiment of a testing column.

FIG. 3A is one embodiment of an exemplary electron beam column 315, which may be used in the test system 100 shown in FIG. 1A as the testing columns 115$_n$, although any other suitable electron beam column may be used. Similar to the embodiment shown in FIG. 2, the column 315 includes an optical axis 301. The optics in the electron beam column 315 guides a primary electron beam 303 towards a target 302, which in one embodiment is a large area substrate having a plurality of electronic devices 333 located thereon. The primary electron beam 303 is emitted by an electron emitter 332, such as a lanthanum hexaboride (LaB$_6$) emitter. The electron emission, the beam current and the shape of a first crossover can be controlled by a grid 334, which may be a Wehnelt grid. The beam energy and the beam shape may be controlled by a beam shaping aperture 339 in an anode 338. A condenser lens 312 including a coil 313 and an objective lens 314 including a coil 323 images the electron beam. The lens 314 may be magnetic, electrostatic, or a combined electrostatic-magnetic lens. In one embodiment, the objective lens 314 includes a main focusing unit and a sub-focusing unit. The sub-focusing unit, which may be, for example, magnetic or electrostatic, is used for minor adjustments as the main focusing unit may not be configured to provide quick corrections due to the electromagnetic induction in the coil.

A deflection system may exemplarily include a magnetic deflector 316A and optionally, an electrostatic deflector 316B, which deflects the electron beam and guides the electron beam onto a location on target 302. During impingement of the primary electron beam 303 onto the target 302, particles, such as secondary or backscattered electrons, photons or X-rays, are released. These particles, which are herein generally referred to as secondary particles, are guided to a detector 324 by a collector 322 having one or more electrodes for guiding the secondary particles dependent on the location on the collector 322 to the detector 324. The detector 324 may detect the secondary particles released from the location of impingement of the primary electron beam 303.

A gun area 307 may typically be a separate vacuum chamber, which can be evacuated by a vacuum pump 304, which may be an ion getter pump, via a valve 305. In one embodiment, the primary beam emission is controlled as follows. A current source heats the emitter 332 by providing a current, which may be controlled, for example, by a temperature, which may be between about 1100° K and about 1400° K. Typically the temperature of the emitter 332 acting as a cathode may be about 1250° K. In one embodiment, a primary energy voltage source 335A applies an extracting voltage of about 500 V to about 900 V, typically about 700 V, which extracts electrons from the emitter 332 or cathode. The grid 334 further focuses the electron beam to form a first crossover.

A blanker voltage source 335C is connected to the grid 334 with a switch 336. In one embodiment, the grid voltage may be changed by about 200 V, or the like. Decreasing the grid voltage by 200 V reduces the extraction voltage to an amount wherein no electrons are extracted from the emitter 332. Thus, the switch 336 may be used to switch between electron emission and no electron emission. The switch 336 and blanker voltage source 335C form a blanker unit for blanking the emission of electrons from the emitter 332.

The primary energy of the electron beam, with respect to the target 302, is controlled by a primary energy voltage source 335A. In the embodiment shown in FIG. 3A, the target 302 and the anode 338 may be at ground potential. The electrons are emitted and accelerated towards the anode 338 to an energy corresponding to the voltage of primary energy voltage source 335A. After passing through the aperture 339 and the grid 334, the electrons impinge on the target 302 with an energy corresponding to the voltage of the primary energy voltage source 335A. The primary energy may be in the range of about 1 keV to about 30 keV, for example, between about 1.5 keV to about 20 keV, such as about 10 keV. In another example, the accelerating voltage for the primary beam may be up to about 12 kV and in some applications, the accelerating voltage may be about 2 kV.

Figure 3B:
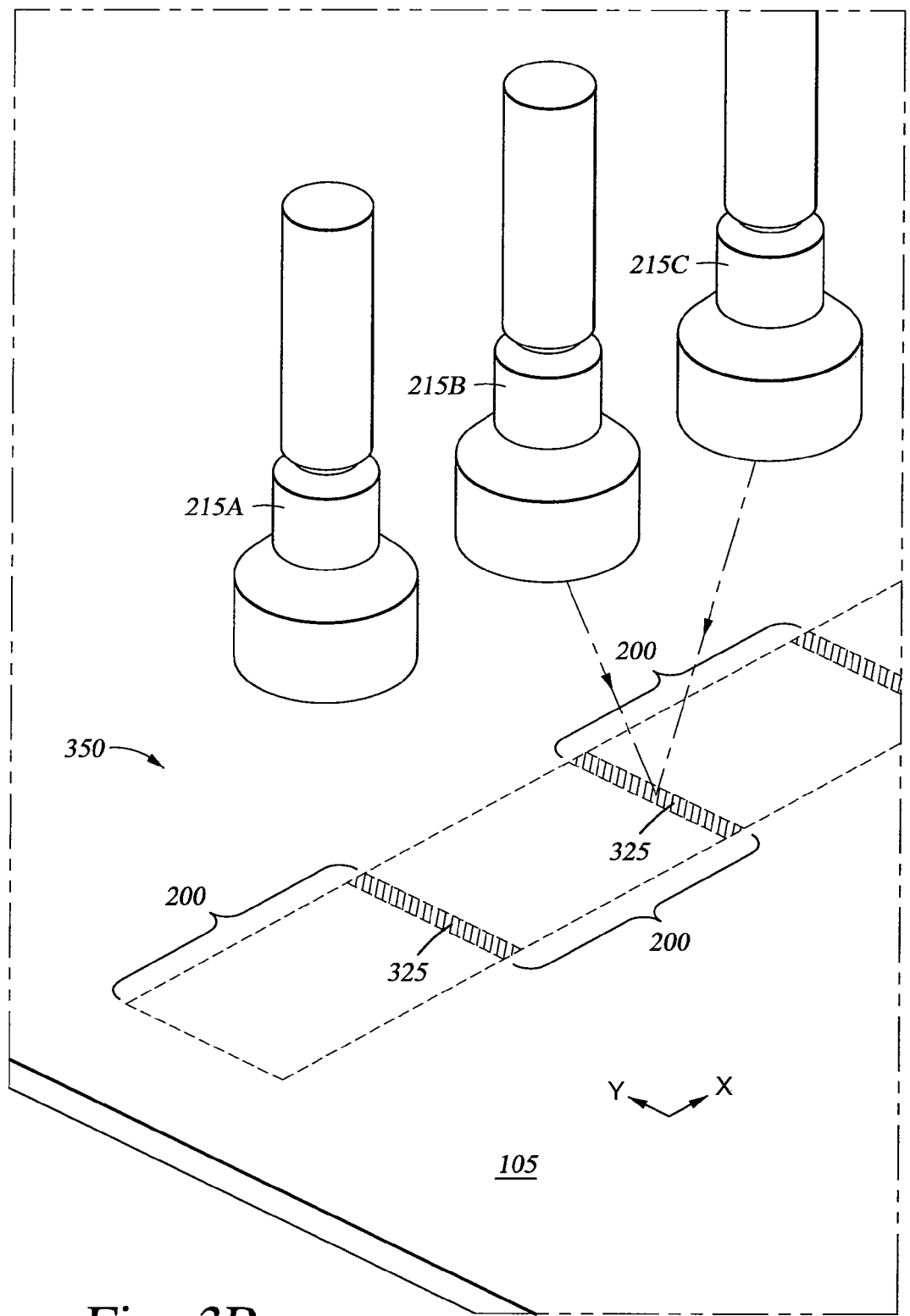
FIG. 3B is one embodiment of a portion of a collective test area.

FIG. 3B is an isometric view of one embodiment of a portion of a collective test area 350 on a large area substrate 105. The portion of the collective test area 350 is produced by beams of electrons from one or more electron beam columns 215A-215C, which may be the electron beam column 315 shown in FIG. 3A. The electron beam columns 215A-215C are adapted to have a collective test area between about 1950 mm to about 2250 mm in the X direction and about 240 mm to about 290 mm in the Y direction when six electron beam columns are used. In another embodiment, the electron beam columns are configured to have a collective test area between about 1920 mm to about 2320 mm in the X direction and about 325 mm to about 375 mm in the Y direction when eight electron beam columns are used. In one embodiment, adjacent electron beam columns may have an overlap 325 in adjacent test areas ranging between about 0.001 mm to about 2 mm, for example about 1 mm. In another embodiment, the test areas of adjacent electron beam columns 215A-215C may not have an overlap 325, thus only touching each other with a negligible gap or no gap at all.

In other embodiments, the collective test area 350 is smaller or greater than the dimensions mentioned above. For example, the collective test area 350 may have a smaller area than described above and more electron beam columns may be used. In another example, the collective test area 350 may be larger than described above and less electron beam columns may be used. Thus, the collective test area 350 of each electron beam column 215A-215C may be based on substrate size, the X and Y movement capabilities of the substrate support, and/or a user's preference.

The adjacent positioning of the plurality of electron beam columns 215A-215C, and the respective test areas 200 emitted on the substrate 105, may cause cross-talk from errant secondary particles generated by one electron beam column registering in a test area 200 and/or a detector 324 (FIG. 3A) of another column. These errant secondary particles from a primary beam from one electron beam column detected as secondary electrons in a test area of an adjacent electron beam column may produce errors in the testing system.

To avoid or minimize errant secondary particles from a primary beam of one electron beam column that are detected in a test or detection area of a neighboring electron beam column, the respective beam position and pulse of the plurality of electron beam columns 215A-215C are synchronized. In one embodiment, an electron column burst, which comprises a primary beam position setting and pulse, is synchronized in a manner wherein the burst is directed to a first position of the columns' respective test area, and the burst from an adjacent column is directed to a second position within an adjacent and respective test area. The first position and second position in the respective test areas may be spaced in a manner wherein any errant secondary electrons emitted from a primary beam from one column superimposes a negligible signal in the respective adjacent test or detection areas. In one embodiment, a vector scan or a synchronous deflection of the electron beam is used. However, the scan or deflection may not be coordinated or synchronized between adjacent columns in the system.

Each testing column $115_n$ of the system shown in FIGS. 1A and 1B deflects the electron beam over the corresponding test area. Within each test area there are a plurality of positions to which the electron beam is deflected. Each of these positions corresponds to one or more electronic devices located on the substrate in the testing area, such as a pixel. Thus, the testing columns $115_n$ of FIGS. 1A and 1B, and the electron beam columns of FIGS. 3A and 3B are operated as follows. The electron beam is switched off for the settling time, in which the electron beam is moved from one pixel to another pixel. The deflection may be provided in a burst, wherein one burst refers to a deflection of the electron beam with the magnetic deflector 31 6A. The magnetic deflector, which has a settling time in the range of about 5 microseconds (µs) to about 30 µs, typically about 13 µs, deflects the beam towards a part of the test area. Within this part of the test area, the electrostatic deflector 316B may be used, which has a faster settling time, such as a settling time in the range of about 300 nanoseconds (ns) to about 600 ns, typically about 500 ns. The electrostatic deflector 316B may be used to deflect the beam from one pixel to another pixel. The electron beam may be switched on for each pixel separately and switched off during each settling time, independent whether it is a settling time of the electrostatic deflector 316B or a settling time of the magnetic deflector 316A.

After all pixels in a part of the test area have been addressed during one burst by operating the electrostatic deflector 316B, the electron beam is deflected with the magnetic deflector 316A to an untested part of the test area. Within the untested part of the test area, the electrostatic deflector 316B again directs the electron beam to the individual pixels. Thus, the electrostatic deflector 316B may, therefore, also be denoted as a sub-deflector.

In another embodiment, a master clock signal is used to synchronize electron beam pulses from the testing columns $115_n$. Especially when a vector positioning of the electron beams is utilized, primary electron beams of neighboring columns may not be deflected synchronously in the same direction. In reference to FIG. 3B for example, the electron beam column 215B deflects the beam to the right side of the corresponding test area 200, whereas, with a similar timing, the electron beam column 215C deflects the electron beam to the left side of the corresponding test area 200. Thereby, cross talk from closely spaced primary electron beams may occur.

In one embodiment of the invention, cross talk is eliminated or significantly reduced by synchronizing neighboring columns to be delayed such that the read time window of neighboring columns is delayed with respect to an adjacent column(s). The synchronization or delay in read time facilitates improved results as signals of neighboring or adjacent columns are not registered at the same time.

Figure 4A:
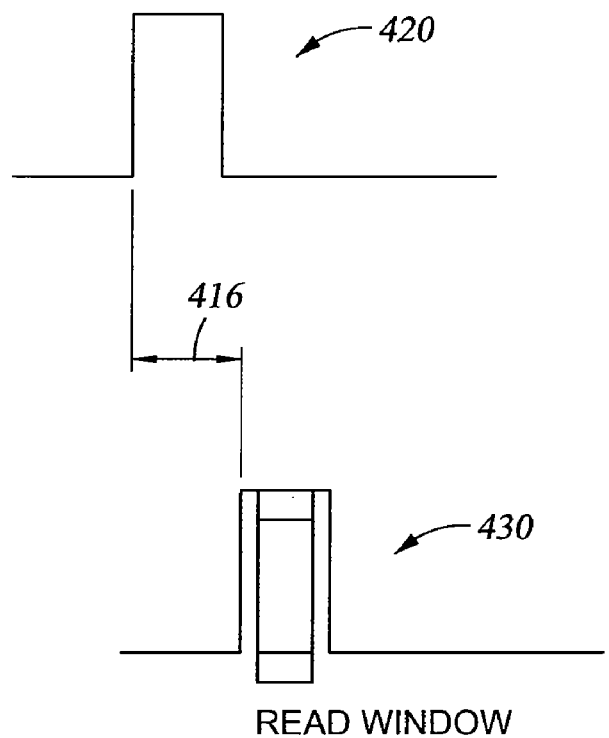
FIG. 4A is a graph of one embodiment of an electron beam pulse and a read window.

FIG. 4A shows an electron beam pulse 420 and a read window 430, which is delayed by delay 416 with respect to the electron beam pulse 420. The electron beam pulse may have a length of about 500 ns to about 900 ns, typically about 750 ns. The signal delay is caused by propagation of the electron beam and the secondary and/or backscattered particles and by signal propagation and registration. As shown in FIG. 4A, the electron beam pulse results in a signal at the detector of the electron beam device which is delayed by delay 416. In one embodiment, the delay 416 is between about 400 ns to about 1000 ns.

Figure 4B:
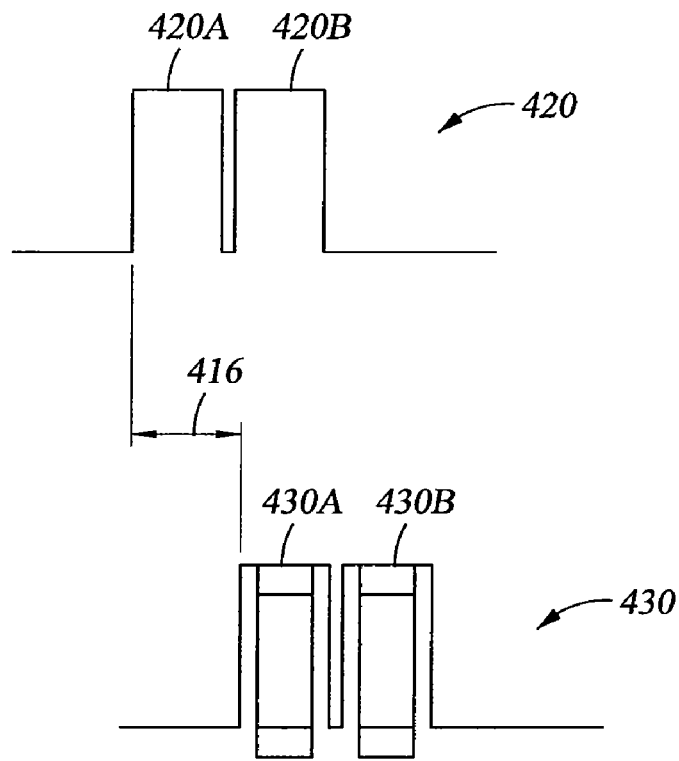
FIG. 4B is a graph of one embodiment of two electron beam pulses and respective read windows.

FIG. 4B shows two electron beam pulses 420A and 420B, which may, for example, propagate from neighboring or adjacent columns. The read windows 430A and 430B are delayed by delays 416A and 416B, respectively. A signal caused by pulse 420A would be present during the read window 430A and a signal caused by pulse 420B would be present during the read window 430B. Since a first signal detection will only be activated during the read window 430A, cross talk from electron beam pulse 420B can be eliminated or significantly reduced and similarly, a second signal detection will only be activated during the read window 430B, and cross talk from electron beam pulse 420A can be eliminated or significantly reduced.

Figure 4C:
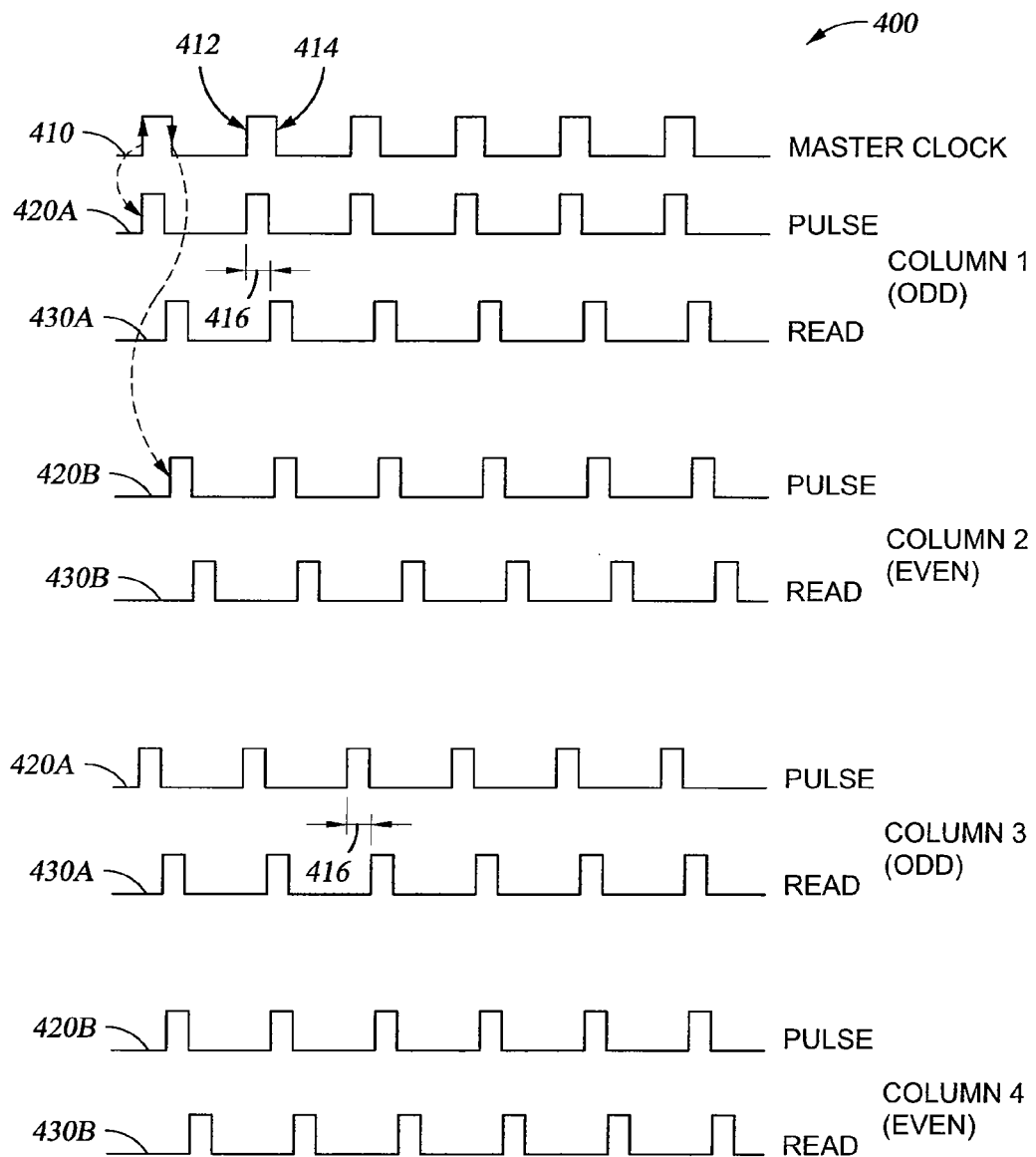
FIG. 4C is a graph showing one embodiment of a synchronization method.

FIG. 4C is a graph showing one embodiment of a synchronization method 400 using a master clock signal 410. The graph includes an electron beam pulse 420A and a read window 430A for odd-numbered electron beam columns, such as column 1 and column 3, and an electron beam pulse 420B and a read window 430B for even-numbered columns, such as column 2 and column 4. The electron beam pulse 420A is switched on to pulse on the rising edge 412 of the master clock signal 410 and the electron beam pulse 420B is switches on to pulse on the falling edge 414 of the master clock signal 410. In one embodiment, each of the rising edge and the falling edge are separate trigger events wherein a first trigger event is provided for the odd-numbered electron beam columns and a second trigger event is provided for the even-numbered electron beam columns. The electron beam of any number of odd-numbered columns may be switched on by the master clock signal 410 to have a substantially simultaneous pulse/read pattern for any number of odd-numbered electron beam columns. The even-numbered columns, such as column 2 and column 4, have an electron beam pulse 420B actuated on the falling edge 414 of the master clock signal 410. The electron beam of any number of even-numbered columns may be switched on by the master clock signal 410 to have a substantially simultaneous pulse/read pattern for any number of even-numbered electron beam columns. Since even-numbered and odd-numbered columns are not located directly adjacent to each other, a distance of at least one test area as described above is between the even-numbered and odd-numbered columns. Thus, cross talk between even-numbered columns and cross talk between odd-numbered columns may be negligible or non-existent.

In this manner, the electron beam pulse 420A of odd-numbered electron beam columns may be switched in substantially simultaneous increments and the electron beam pulse 420B of even-numbered electron beam columns may be switched in substantially simultaneous increments. The read windows 430A of the odd-numbered electron beam columns (e.g. columns 1 and 3) and the read windows 430B of the even-numbered electron beam columns (e.g. columns 2 and 4) each have a delay 416. As previously described with respect to FIG. 4B, these read windows are separated from each other. Since the first signal detection will only be activated during the read window 430A, a cross talk from electron beam pulse 420B can be eliminated or significantly reduced. Since the second signal detection will only be activated during the read window 430B, a cross talk from electron beam pulse 420A can be eliminated or significantly reduced. One electron beam column does not generate a signal during the read window of a neighboring column.

In operation, a timing sequence of the test system 100 as shown in FIG. 1A, including the testing columns $115_n$ as described herein will be described. Each of the columns are operated in burst, which relates to a control of the magnetic deflector 316A to deflect the electron beam to a part of the test area having a plurality of pixels, which may be referred to as a sub-test area within each of the test areas 200. During the burst, within the respective part of the sub-test area, the electrostatic deflector 316B deflects the beam from one pixel to another pixel. After all pixels of the sub-test area have been tested, i.e. all pixels of one burst have been measured, the next part of the test area is addressed, i.e. the beam is deflected to another sub-test area. The electron beam is switched off between each deflection from one pixel to another pixel, which includes the deflection from one sub-test area to another sub-test area of the test area in a burst to burst pattern.

In the moment an electron beam column deflected the beam to the next sub-test area of the test area, odd-numbered columns are delayed to a rising edge of the master signal and even-numbered columns are delayed to a falling edge of the master signal. In another embodiment, the system may also be operated with even-numbered columns being triggered by the rising edge and odd-numbered columns being triggered by the falling edge.

The system is operated in a manner wherein no neighboring electron beam columns are triggered at the same time. The triggering events are independent of the settling time. If the settling time from one pixel to another pixel results from a burst to burst deflection, i.e., a deflection with the magnetic deflector (settling time of about 13 µs), a plurality of rising/falling edges (master-signal events) may elapse. As soon as the beam deflection occurs, which may be a combination of magnetic and electrostatic deflection, the next rising/falling edge triggers the column depending on whether an odd-numbered or even-numbered column is to be triggered. If the settling time from one pixel to another pixel results from a deflection with the electrostatic deflector (settling time of about 500 ns), master signal events may not occur. In this case for a deflection within a burst, the electron beam may be correctly positioned such that two subsequent rising/falling edges trigger the column depending upon whether an odd-numbered or even-numbered column is to be triggered. However, if one master-signal event would occur within a burst and the electrostatic deflection system would not yet have positioned the electron beam to the desired pixel, one, two or a few master-signal events may elapse. As soon as the beam deflection is correctly positioned, the next rising/falling edge triggers the column depending on whether an odd-numbered or even-numbered column is to be triggered.

Generally, many pixels are tested within a burst. Given that the even-numbered columns are using bursts with substantially the same timing, and the odd-numbered columns are using bursts with substantially the same timing, the column or columns to be synchronized only have to wait for the next corresponding trigger event. Thus, the impact on throughput is negligible.

In another embodiment, the trigger event for the odd-numbered columns and the trigger event for the even-numbered columns is not a rising or a falling edge of one master signal, but are separately provided trigger events, which are synchronized such that the trigger event for the odd-numbered electron beam columns and the trigger event for the even-numbered electron beam columns occurs at a different time period and does not coincide. According to an even further embodiment, each column $115_n$ of the system as shown in FIG. 1A has its own trigger event. Cross talk can be avoided or eliminated when the triggering events of neighboring columns are at different times and do not coincide.

While the foregoing is directed to embodiments of the present invention, other and further embodiments of the invention may be devised without departing from the basic scope thereof, and the scope thereof is determined by the claims that follow.

The invention claimed is:

1. A method of reducing cross-talk between at least a first electron beam column and at least a second electron beam column neighboring the first electron beam column, comprising:
   providing a first trigger event;
   emitting a first electron beam pulse on a substrate with the first electron beam column at a first predetermined time after the first trigger event;
   detecting a first signal from the first electron beam pulse at a second predetermined time after the first trigger event in a first read window;
   providing a second trigger event;
   emitting a second electron beam pulse on the substrate with the second electron beam column at a third predetermined time after the second trigger event; and
   detecting a second signal from the second electron beam pulse at a fourth predetermined time after the second trigger event in a second read window, wherein the first read window and the second read window occupy different time periods.

2. The method of claim 1, wherein the first predetermined time is substantially equal to the third predetermined time and the second predetermined time is substantially equal to the fourth predetermined time.

3. The method of claim 1, wherein the first read window and the second read window do not overlap.

4. The method of claim 1, wherein the first trigger event is a rising edge of a master signal and the second trigger event is a falling edge of the master signal.

5. The method of claim 1, wherein the first trigger event is a falling edge of a master signal and the second trigger event is a rising edge of the master signal.

6. The method of claim 1, wherein each electron beam column comprises a diagonally measured test area on the substrate that is between about 380 mm and about 440 mm.

7. A method of reducing crosstalk between a plurality of odd-numbered electron beam columns with at least one even-numbered electron beam column therebetween, comprising:
   providing a master clock signal having a rising edge and a falling edge;
   synchronizing a first pulse of electrons from the plurality of odd-numbered electron beam columns or the at least one even-numbered electron beam column that coincides with the rising edge; and
   synchronizing a second pulse of electrons from the plurality of odd-numbered electron beam columns or the at least one even-numbered electron beam column that coincides with the falling edge, wherein the first pulse and second pulse are separated by a delay.

8. The method of claim 7, wherein the synchronizing steps include synchronizing the first pulse to emit at a predetermined period before, after, or equal to the rising edge, and synchronizing the second pulse to emit at a predetermined period before, after, or equal to the falling edge.

9. The method of claim 8, further comprising:
- detecting a first signal from the odd-numbered electron beam columns in a first read window after the first pulse; and
- detecting a second signal from the at least one even-numbered electron beam column in a second read window after the second pulse.

10. The method of claim 7, wherein the first pulse of electrons is emitted from the odd-numbered electron beam columns, and the second pulse of electrons is emitted from the at least one even-numbered electron beam column.

11. The method of claim 7, wherein each electron beam column comprises a diagonally measured test area on the substrate that is between about 380 mm and about 440 mm.

12. The method of claim 7, wherein each electron beam column comprises a test area on the substrate that is about 305 mm to about 330 mm in the X direction.

13. The method of claim 7, wherein the delay time is between about 400 ns and about 1000 ns.

14. An electron beam test system comprising:
- a plurality of electron beam columns comprising:
  - one or more odd-numbered columns and one or more even-numbered columns, each of the plurality of electron beam columns including a blanking system and a detector; and
- a synchronizing device having a master clock signal defining a first trigger event and a second trigger event, wherein the blanking system and detector of each electron beam column is in communication with the master clock signal and the blanking system of the one or more odd-numbered columns are triggered at the first trigger event, and the blanking system of the one or more even-numbered columns are triggered at the second trigger event, or vice-versa.

15. The test system of claim 14, wherein the one or more even-numbered columns are triggered at the first trigger event, and the one or more odd-numbered columns are triggered at the second trigger event.

16. The test system of claim 14, wherein the plurality of electron beam columns are adjacent and in a substantially straight line.

17. The test system of claim 14, wherein each of the plurality of electron beam columns have a test area.

18. The test system of claim 14, wherein the blanking system of the one or more odd-numbered columns switches at a first predetermined time after the first trigger event and the blanking system of the one or more even-numbered columns switches at a second predetermined time after the second trigger event.

19. The test system of claim 18, wherein the first predetermined time and the second predetermined time do not overlap.

20. The test system of claim 18, wherein the first predetermined time and the second predetermined time are different.

21. The test system of claim 14, further comprising:
- a read window in communication with the synchronizing device and the detector, wherein the read window for the one or more odd-numbered columns is switched on for a first period after the first trigger event, and the read window for the one or more even-numbered columns is switched on for a second period after the second trigger event.

22. The test system of claim 21, wherein the first period and the second period are different and do not overlap.

23. The test system of claim 14, wherein the plurality of electron beam columns includes at least six electron beam columns.

24. The test system of claim 14, wherein the plurality of electron beam columns includes at least eight electron beam columns.

25. The test system of claim 14, wherein each electron beam column comprises a diagonally measured test area on the substrate that is about 380 mm by about 440 mm.

* * * * *

UNITED STATES PATENT AND TRADEMARK OFFICE
CERTIFICATE OF CORRECTION

PATENT NO. : 7,569,818 B2  
APPLICATION NO. : 11/684745  
DATED : August 4, 2009  
INVENTOR(S) : Schmid et al.

It is certified that error appears in the above-identified patent and that said Letters Patent is hereby corrected as shown below:

In Detailed Description:

Column 9, Line 28, please delete "31 6A" and insert --316A-- therefor.

Signed and Sealed this

Twenty-second Day of September, 2009

David J. Kappos  
*Director of the United States Patent and Trademark Office*